(12) United States Patent
Park et al.

(10) Patent No.: US 10,502,804 B2
(45) Date of Patent: Dec. 10, 2019

(54) MAGNETIC RESONANCE IMAGING APPARATUS AND METHOD OF CONTROLLING THE SAME

(71) Applicants: SAMSUNG ELECTRONICS CO., LTD., Suwon-si (KR); KOREA ADVANCED INSTITUTE OF SCIENCE AND TECHNOLOGY, Daejeon (KR)

(72) Inventors: Hyun Wook Park, Daejeon (KR); Jae Jin Cho, Daejeon (KR); Dongchan Kim, Incheon (KR); Hyunseok Seo, Daejeon (KR); Kinam Kwon, Daejeon (KR); Seohee So, Daejeon (KR)

(73) Assignees: SAMSUNG ELECTRONICS CO., LTD., Suwon-si (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 114 days.

(21) Appl. No.: 15/680,978

(22) Filed: Aug. 18, 2017

(65) Prior Publication Data

US 2018/0210059 A1 Jul. 26, 2018

(30) Foreign Application Priority Data

Jan. 20, 2017 (KR) .................. 10-2017-0009749

(51) Int. Cl.
*G01R 33/565* (2006.01)
*G01R 33/561* (2006.01)
(Continued)

(52) U.S. Cl.
CPC ... *G01R 33/56527* (2013.01); *G01R 33/4835* (2013.01); *G01R 33/5608* (2013.01); *G01R 33/5611* (2013.01)

(58) Field of Classification Search
CPC .......... G01R 33/56527; G01R 33/4835; G01R 33/5608; G01R 33/5611; G01R 33/561; G01R 33/4828
(Continued)

(56) References Cited

U.S. PATENT DOCUMENTS

| 4,720,679 A | * | 1/1988 | Patrick | G01R 33/24 |
|---|---|---|---|---|
| | | | | 324/309 |
| 5,327,088 A | * | 7/1994 | Pipe | G01R 33/561 |
| | | | | 324/307 |

(Continued)

OTHER PUBLICATIONS

JaeJin Cho et al., "Correction of Chemical-Shift Ghost Artifact in Blipped Controlled Aliasing Parallel Imaging", Korea Advanced Institute of Science and Technology (KAIST), Daejeon, Korea, Republic of, 2016 (4 Pages Total) URL: http://indexsmart.mirasmart.com/ISMRM2016/PDFfiles/0610.html[Oct. 11, 2016 6:54:08].

*Primary Examiner* — Patrick Assouad
*Assistant Examiner* — Demetrius R Pretlow
(74) *Attorney, Agent, or Firm* — Sughrue Mion, PLLC

(57) ABSTRACT

A method of controlling a magnetic resonance imaging (MRI) apparatus including performing, by the MRI apparatus, blipped-controlled aliasing parallel imaging (blipped-CAIPI) obtaining k-space data on a subject determining a phase error of a chemical shift component, wherein the phase error of the chemical shift component is proportional to a geometric error based on a resonant frequency difference between a main component and the chemical shift component in the subject comparing the k-space data with data in which the phase error of the chemical shift component is reflected, wherein the data in which the phase error of the chemical shift component is reflected is associated with data on the main component and data on the chemical shift component and determining final data for image restoration based on a result of the comparison.

18 Claims, 17 Drawing Sheets

(51) Int. Cl.
*G01R 33/56* (2006.01)
*G01R 33/483* (2006.01)

(58) Field of Classification Search
USPC .......................................................... 324/309
See application file for complete search history.

(56) References Cited

U.S. PATENT DOCUMENTS

| | | | |
|---|---|---|---|
| 6,445,182 B1* | 9/2002 | Dean | G01R 33/4822 |
| | | | 324/307 |
| 2002/0167315 A1* | 11/2002 | Kellman | G01R 33/5611 |
| | | | 324/307 |
| 2005/0033153 A1* | 2/2005 | Moriguchi | G01R 33/565 |
| | | | 600/410 |
| 2006/0250131 A1 | 11/2006 | Reeder et al. | |
| 2008/0048659 A1 | 2/2008 | Reeder | |
| 2013/0251227 A1* | 9/2013 | Wang | G01R 35/00 |
| | | | 382/131 |
| 2015/0091571 A1* | 4/2015 | Park | G01R 33/56383 |
| | | | 324/309 |
| 2015/0241537 A1* | 8/2015 | Dannels | G01R 33/56554 |
| | | | 324/309 |
| 2015/0346304 A1* | 12/2015 | Hu | A61B 5/055 |
| | | | 600/411 |
| 2016/0018497 A1* | 1/2016 | Park | G01R 33/567 |
| | | | 324/309 |
| 2016/0041247 A1* | 2/2016 | Feiweier | A61B 5/055 |
| | | | 324/309 |
| 2016/0170002 A1* | 6/2016 | Park | G01R 33/4835 |
| | | | 324/309 |
| 2016/0282437 A1* | 9/2016 | Park | G01R 33/4835 |
| 2017/0146624 A1* | 5/2017 | Paul | G01R 33/4835 |
| 2017/0307717 A1* | 10/2017 | Geraghty | G01R 33/56554 |
| 2017/0322274 A1* | 11/2017 | Bolster, Jr. | G01R 33/5615 |
| 2018/0011158 A1* | 1/2018 | Katscher | A61B 5/055 |
| 2018/0164395 A1* | 6/2018 | Setsompop | G01R 33/543 |

* cited by examiner

FIG. 9
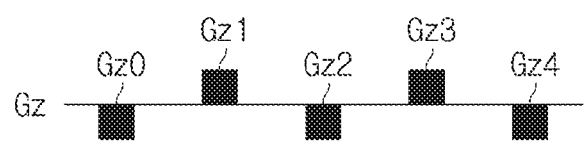
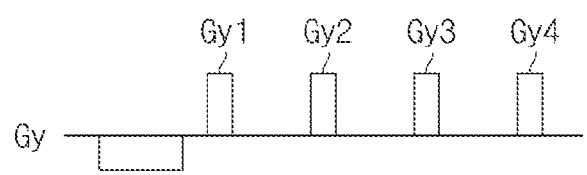
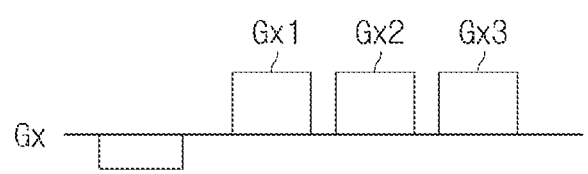

MAGNETIC RESONANCE IMAGING APPARATUS AND METHOD OF CONTROLLING THE SAME

CROSS-REFERENCE TO RELATED APPLICATION

This application claims benefit from Korean Patent Application No. 10-2017-0009749, filed on Jan. 20, 2017 in the Korean Intellectual Property Office, the disclosure of which is incorporated herein by reference.

BACKGROUND

1. Field

Methods and apparatuses consistent with exemplary embodiments relate to a magnetic resonance imaging apparatus and a method of controlling the same.

2. Description of Related Art

A magnetic resonance imaging (MRI) apparatus is an apparatus that obtains data on an internal structure of a subject and generates and provides an image in a form which a user may see based on the obtained data. The MRI apparatus may image an internal slice of a subject using a nuclear magnetic resonance (NMR) phenomenon, which is a phenomenon in which an atomic nucleus resonates with an electromagnetic wave having a constant frequency.

An atomic nucleus of hydrogen (H), phosphorus (P), sodium (Na), various carbon isotopes, or the like inside a subject has a spin. Therefore, when the atomic nucleus is magnetized by being exposed to an external magnetic field, the spin of the atomic nucleus is aligned in a direction of the magnetic field and performs precession at a Larmor frequency to have a predetermined angle with a central axis according to a torque received by the magnetic field. A size of the Larmor frequency is proportional to an intensity of the applied magnetic field. When an electromagnetic wave having the same or approximate frequency as the Larmor frequency is applied to the above-described atomic nucleus, a magnetization vector of the atomic nucleus resonates with the electromagnetic wave and is directed in a direction perpendicular to the applied magnetic field, and when the application of the electromagnetic wave is stopped, the magnetization vector of the atomic nucleus returns to its original state. In this case, the magnetization vector induces a voltage signal, which is commonly referred to as a free induction decay (FID) signal, at an adjacent high-frequency coil. The MRI apparatus generates an image of an inside of a subject using the induced voltage signal and provides the generated image to a user.

MRI apparatuses are being widely used for biotechnology research and medical examination because they may obtain detailed images of an inside of an object and there is no problem of radiation exposure caused by a radiography apparatus.

SUMMARY

Therefore, it is an aspect of the present disclosure to provide a magnetic resonance imaging (MRI) apparatus capable of removing artifacts in an image, which are caused by an excitation position error of a chemical shift material, in a blipped-controlled aliasing parallel imaging (blipped-CAIPI) method, and a method of controlling the same.

Additional aspects of the disclosure will be set forth in part in the description which follows and, in part, will be obvious from the description, or may be learned by practice of the disclosure.

According to an aspect of an exemplary embodiment, a method of controlling a magnetic resonance imaging (MRI) apparatus includes performing, by the MRI apparatus, blipped-controlled aliasing parallel imaging (blipped-CAIPI) obtaining k-space data on a subject determining a phase error of a chemical shift component, wherein the phase error of the chemical shift component is proportional to a geometric error based on a resonant frequency difference between a main component and the chemical shift component in the subject comparing the k-space data with data in which the phase error of the chemical shift component is reflected, wherein the data in which the phase error of the chemical shift component is reflected is associated with data on the main component and data on the chemical shift component and determining final data for image restoration based on a result of the comparison.

The geometric error may be determined in proportion to the resonant frequency difference between the main component and the chemical shift component in the subject.

The geometric error may be further determined using a gyromagnetic ratio and a size of a gradient magnetic field applied to the subject.

The phase error of the chemical shift component may be determined in proportion to the geometric error, a size of a blip of a gradient magnetic field, and a time at which the blip of the gradient magnetic field is applied to the subject.

The comparing may include calculating the data in which the phase error of the chemical shift component is reflected by the phase error of the chemical shift component being reflected in Fourier transform data of the data on the main component and the data on the chemical shift component, calculating a difference between the data in which the phase error of the chemical shift component is reflected and the k-space data, and the determining may include determining the final data on based on a result of the calculation of the difference.

The calculating of the data in which the phase error of the chemical shift component is reflected may include calculating the data in which the phase error of the chemical shift component is reflected using at least one from among a gradient magnetic field phase reflection operator for reinforcing a phase due to a gradient magnetic field when the blipped-CAIPI is performed, a chemical shift phase reflection operator for reinforcing a phase error caused by chemical shift, and a coil sensitivity reflector for coil sensitivity being reflected in the data, which is further reflected in the Fourier transform data by the MRI apparatus.

The determining may include determining the final data in which an amount of change of the data on the main component and the data on the chemical shift component are further reflected.

The comparing may be calculated as follows, $$\rho = \underset{\rho}{\mathrm{argmin}} \|s - \Theta\Phi\Psi FC\rho\|_2^2 + \lambda\|\nabla\rho\|_1$$

wherein, $\rho$ represents target data, s represents the obtained k-space data, $\Theta$ represents a phase error operator for applying the phase error of the chemical shift component, $\phi$ represents a gradient magnetic field phase reflection operator, $\psi$ represents a chemical shift phase reflection operator, F represents a Fourier transform operator for performing a Fourier transform on each of the main component and the chemical shift component, C represents a generalized coil sensitivity reflector, ρ represents the data on the main component and the data on the chemical shift component, λ represents a normalization coefficient, and ∇ is a gradient operator.

Θ may be defined as follows, $$\Theta = \exp(-j\alpha)$$

wherein j represents a predefined constant and α represents the phase error of the chemical shift component.

The phase error (α) may be calculated as follows:

$$\alpha = 2\pi\gamma G_b T_b z_f$$

and $$z_f = \frac{f_f}{\gamma G_{ss}}$$

wherein, γ represents a gyromagnetic ratio, $G_b$ represents a size of a blip of a gradient magnetic field, $T_b$ represents a gradient magnetic field application time, $z_f$ represents the geometric error, $f_f$ represents a resonant frequency difference between the main component and the chemical shift component, and $G_{ss}$ represents a size of the gradient magnetic field.

According to another aspect of an exemplary embodiment, an MRI apparatus may includes a static magnetic field generator configured to apply a static magnetic field to a subject, a gradient magnetic field generator configured to apply a gradient magnetic field to the subject, the gradient magnetic field generator including a slice-select gradient magnetic field application part, a frequency-encoding gradient magnetic field application part, and a phase-encoding gradient magnetic field application part, a radio frequency (RF) coil configured to apply an RF pulse to the subject and receive a signal generated by the subject, and a processor configured to obtain k-space data on the subject, wherein the slice-select gradient magnetic field application part may be configured to further apply a slice-select gradient magnetic field to the subject and perform blipped-CAIPI, wherein the processor may be further configured to determine a phase error of a chemical shift component, compare the k-space data to data in which the phase error of the chemical shift component is reflected, wherein the data in which the phase error of the chemical shift component is reflected is associated with data on a main component and data on a chemical shift component, and determine final data for image restoration based on a result of the comparison, and wherein the phase error of the chemical shift component is proportional to a geometric error based on a resonant frequency difference between the main component and chemical shift component in the subject.

The geometric error may be determined in proportion to the resonant frequency difference between the main component and the chemical shift component in the subject.

The geometric error may be further determined using a gyromagnetic ratio and a size of a gradient magnetic field applied to the subject.

The phase error of the chemical shift component may be determined in proportion to the geometric error, a size of a blip of the gradient magnetic field, and a time at which the blip of the gradient magnetic field is applied.

The processor may be further configured to calculate the data in which the phase error of the chemical shift component is reflected by the phase error of the chemical shift component being reflected in Fourier transform data of the data on the main component and the data on the chemical shift component, to calculate a difference between the data in which the phase error of the chemical shift component is reflected and the k-space data, and to determine final data based on a result of the calculation of the difference.

The processor may be further configured to calculate the data in which the phase error of the chemical shift component is reflected using at least one from among a gradient magnetic field phase reflection operator for reinforcing a phase due to the gradient magnetic field when the blipped-CAIPI is performed, a chemical shift phase reflection operator for reinforcing a phase error caused by chemical shift, and a coil sensitivity reflector for coil sensitivity being reflected in the data, which is further reflected in the Fourier transform data by the MRI apparatus.

The processor may be further configured to determine the final data in which an amount of change of the data on the main component and the data on the chemical shift component are further reflected.

The phase error (α) may be calculated as follows:

$$\alpha = 2\pi\gamma G_b T_b z_f$$

and $$z_f = \frac{f_f}{\gamma G_{ss}}$$

wherein, γ represents a gyromagnetic ratio, $G_b$ represents a size of a blip of a gradient magnetic field, $T_b$ represents a gradient magnetic field application time, $z_f$ represents the geometric error, $f_f$ represents the resonant frequency difference between the main component and the chemical shift component, and $G_{ss}$ represents a size of the gradient magnetic field.

BRIEF DESCRIPTION OF THE DRAWINGS

These and/or other aspects of the disclosure will become apparent and more readily appreciated from the following description of the exemplary embodiments, taken in conjunction with the accompanying drawings of which:

FIG. 9 is a diagram illustrating an example of a pattern of magnetic field blips applied to a subject to perform a blipped-CAIPI method.

DETAILED DESCRIPTION

Hereinafter, exemplary embodiments of a magnetic resonance imaging (MRI) apparatus will be described with reference to FIGS. 1 to 16.

Figure 1:
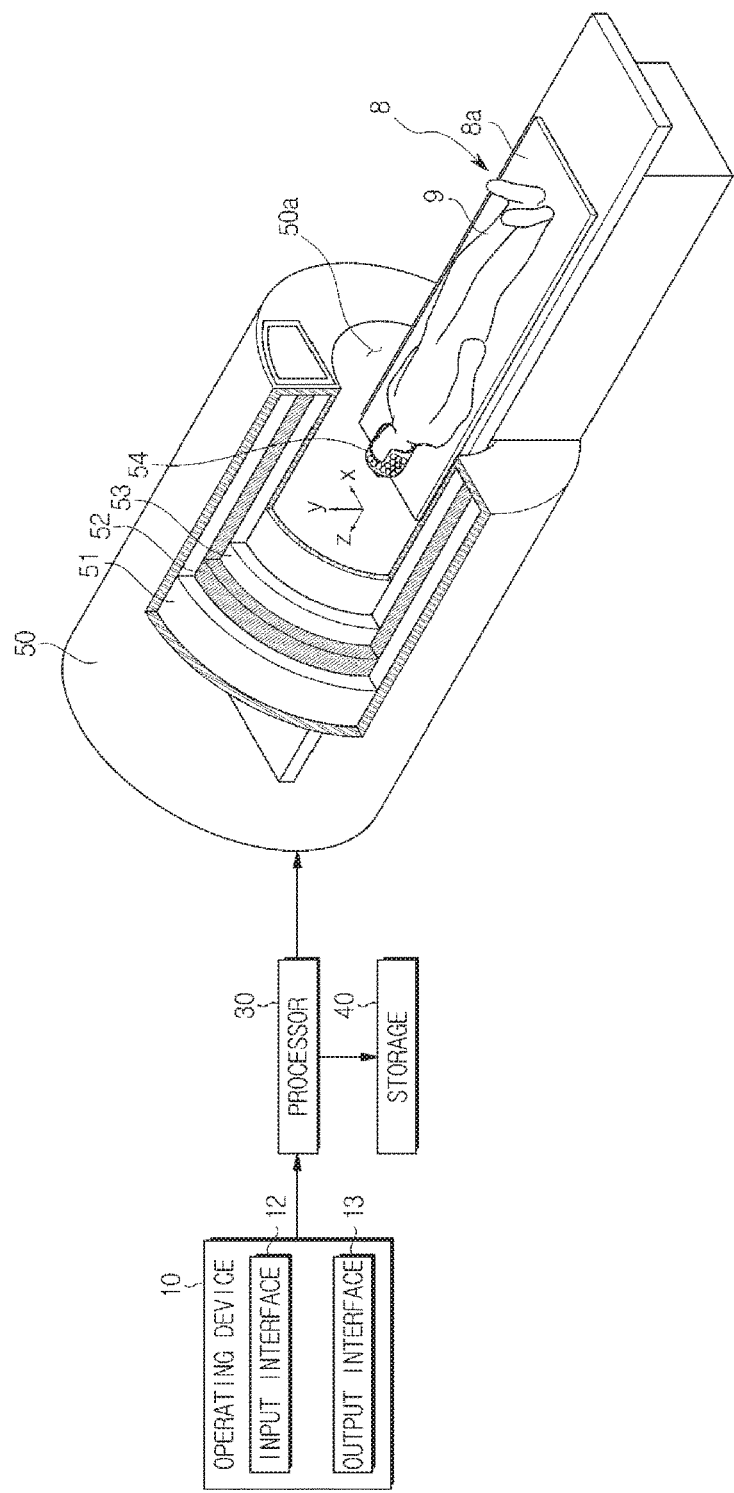
FIG. 1 is a diagram for describing an exemplary embodiment of the MRI apparatus.

FIG. 1 is a diagram for describing an exemplary embodiment of the MRI apparatus.

According to the exemplary embodiment illustrated in FIG. 1, an MRI apparatus 1 may include an operating device 10, a processor 30, a storage 40, and a scanner 50.

The operating device 10, the processor 30, the storage 40, and the scanner 50 are provided to communicate with each other through at least one of wired communication networks and wireless communication networks. Here, the wired communication network may be implemented using various cables such as pair cables, coaxial cables, fiber optic cables, and Ethernet cables. The wireless communication network may be implemented using at least one of a short range communication technology and a long-distance communication technology. The short range communication technology may include wireless fidelity (Wi-Fi), ZigBee, Bluetooth, Wi-Fi Direct, Bluetooth low energy, near field communication (NFC), or the like. Further, the long-distance communication technology may include various communication technologies based on various mobile communication standards such as 3rd generation partnership project (3GPP), 3GPP2, worldwide interoperability for microwave access (WiMAX) series, or the like.

The operating device 10 may receive various commands used to operate the MRI apparatus 1 from a user and/or may display an image corresponding to an electrical signal obtained via the scanner 50 to the user.

The operating device 10 may include at least one of an input interface 12 and an output interface 13.

The input interface 12 may receive a control command related to the overall operation of the MRI apparatus 1 from the user. For example, the input interface 12 may receive a command of the scanner 50, such as an operation start command or an operation stop command, from the user, and may also receive a transfer command of a transfer unit 8. The input interface 12 may be implemented as, for example, each of a physical button such as a keyboard and the like, a mouse, a stick manipulation device, a trackball, a voice recognition device, a gesture recognition device, a touch screen, or the like, or may be implemented as a combination thereof.

The output interface 13 may provide various types of information used by the user in the form of an image, a sound, or various other forms. For example, the output interface 13 may be implemented using a display device for displaying an image or may be implemented using a speaker.

The display device visually outputs a magnetic resonance image generated on the basis of electrical signals obtained by the scanner 50 and provides the magnetic resonance image to the user. The display device may also output a graphic user interface (GUI) configured to allow the user to input a control command related to the MRI apparatus 1.

The display device may be implemented, for example, using a cathode ray tube (CRT) or various other types of display panels such as a liquid crystal display (LCD) panel, a light-emitting diode (LED) panel, an organic light-emitting diode (OLED) panel, and the like.

The processor 30 may generate a control signal related to the overall operation of the MRI apparatus 1 according to a control command of the user that is input through the input interface 12 or a predefined setting, transfer the generated control signal to each of the components, and allow the MRI apparatus 1 to perform a predetermined operation.

For example, the processor 30 may control a static magnetic field generator 51 and/or a gradient magnetic field generator 52 of the scanner 50 to receive predetermined power so that the static magnetic field generator 51 or the gradient magnetic field generator 52 may apply a static magnetic field or a gradient magnetic field to a subject 9. The processor 30 may transmit the control signal to a radio frequency (RF) coil 53 of the scanner 50 and allow the RF coil 53 to transmit an RF pulse to the subject 9. In addition, the processor 30 may control the MRI apparatus 1 to perform various operations.

Further, the processor 30 may allow the storage 40 to store a magnetic resonance signal obtained by the scanner 50, and may generate a visible image of the subject 9 using the stored magnetic resonance signal.

For example, the processor 30 may generate a k-space by arranging k-space data corresponding to a magnetic resonance signal received by the RF coil 53 and acquire a magnetic resonance image of the subject 9 from the k-space generated through various restoration methods such as a Fourier transform and the like.

The processor 30 may amplify the magnetic resonance signal and/or convert the magnetic resonance signal into a digital signal before the k-space data is obtained.

Further, the processor 30 may further perform post image processing such as emphasizing contrast of the acquired magnetic resonance image or removing noise therefrom, or may generate a new image by combining a plurality of images or by subtracting another image from one image. These operations will be described below.

Further, the processor 30 may control the scanner 50 so that the scanner 50 performs blipped-controlled aliasing parallel imaging (blipped-CAIPI).

Further, the processor 30 may determine a phase error of a chemical shift component and restore an image using the phase error of the chemical shift component. Also, the processor 30 may first determine a geometric error on the basis of a resonant frequency difference between a main component and a chemical shift component in the subject 9 to determine the phase error of the chemical shift component.

The blipped-CAIPI and the operation of the processor 30 for determining the phase error of the chemical shift component will be described below.

The processor 30 may be implemented using at least one semiconductor chip and related parts. The processor 30 may include, for example, a central processing unit (CPU), a micro controller unit (MCU), a micro-processor unit (MPU), or the like.

In some exemplary embodiments, the operating device 10 and the processor 30 may be implemented as separate devices, as illustrated in FIG. 1, or may be integrally included in one device. Further, in some exemplary embodiments, the processor 30 may be embedded in an external housing of the scanner 50.

Further, in some exemplary embodiments, the operating device 10 and the processor 30 may be connected to a separate external server or terminal through a wired and/or wireless communication network and may transmit obtained data, for example, a magnetic resonance image, to the separate server or terminal.

The scanner 50 is provided to obtain the magnetic resonance signal from the subject 9.

An internal room 50a which is empty so that the subject 9 is inserted thereinto, for example, a bore, is provided in the scanner 50. The scanner 50 may include the static magnetic field generator 51 for forming a static magnetic field in the subject 9 inserted into the internal room 50a around the internal room 50a, the gradient magnetic field generator 52 for forming a gradient magnetic field in the subject 9 inserted into the internal room 50a, and the RF coil 53 for applying an RF pulse to the subject 9 and receiving a magnetic resonance signal generated by the subject 9.

The subject 9 is transferred into the internal room 50a by the transfer unit 8. Here, the subject 9 may include various types of objects of which an inside may be imaged by the MRI apparatus in addition to a human body. The transfer unit 8 may include a transfer table having at least one mounting plate 8a formed thereon on which the subject 9 may be mounted, and the mounting plate 8a is movably provided using various transfer units such as rails or the like so that the subject 9 placed on an upper surface of the mounting plate 8a is transferred into the internal room 50a of the scanner 50.

The static magnetic field generator 51 generates a static magnetic field having a predetermined intensity in the internal room 50a. In this case, the static magnetic field may be formed in a longitudinal direction of the mounting plate 8a of the transfer unit 8. In other words, when the subject 9 is a human body, the static magnetic field may be formed in a direction from a head of the human body to a leg thereof or in a direction opposite thereto.

The generated static magnetic field magnetizes atoms which cause a magnetic resonance phenomenon among elements distributed in the subject 9, for example, an atomic nucleus of an element such as hydrogen, phosphorus, sodium, or the like, so that a spin of the atomic nucleus is aligned in the direction of the static magnetic field.

The static magnetic field generator 51 may be made of a superconducting electromagnet or a permanent magnet. When a superconducting electromagnet is used, a magnetic field having a high magnetic flux density of 0.5 tesla or more may be formed in the internal room 50a.

Figure 2:
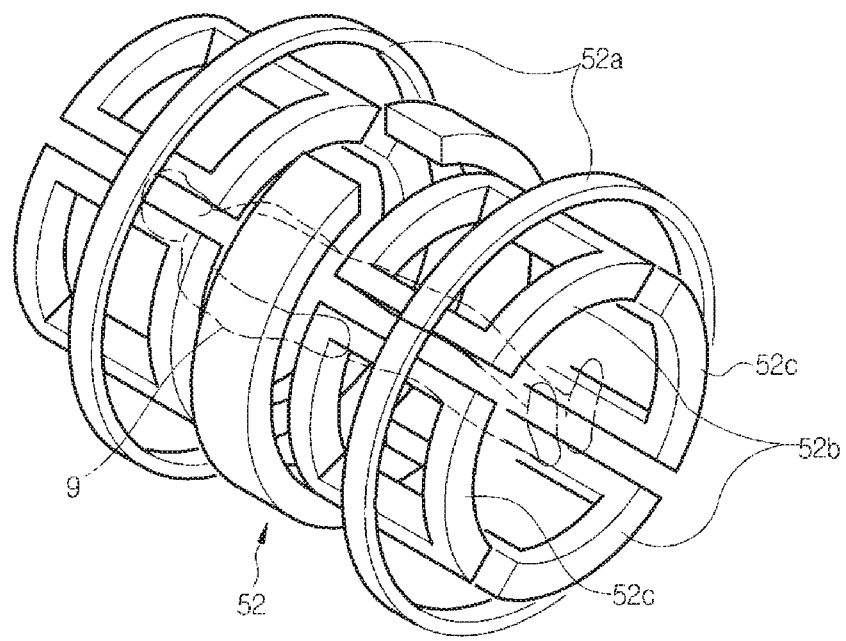
FIG. 2 is a view illustrating an example of a gradient magnetic field generator.
Figure 3:
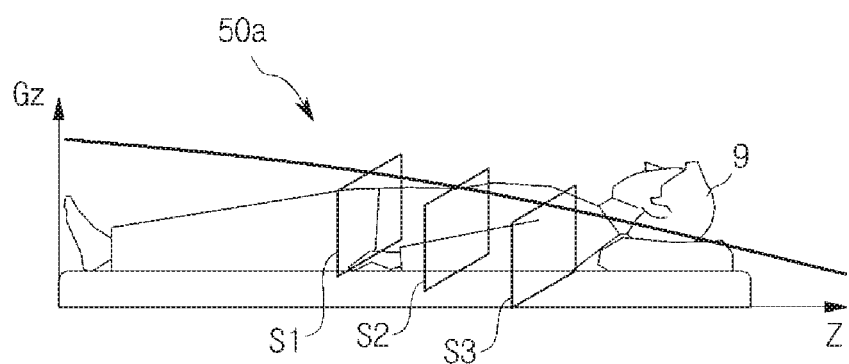
FIG. 3 is a view for describing slices and a gradient magnetic field applied in a longitudinal direction of a subject.

FIG. 2 is a view illustrating an example of a gradient magnetic field generator, and FIG. 3 is a view for describing slices and a gradient magnetic field applied in a longitudinal direction of a subject. In FIG. 3, a Y-axis represents a size of a slice-select gradient magnetic field Gz, an Z-axis represents a position, and a line segment across the subject 9 represents a change of a size of the slice-select gradient magnetic field Gz.

The gradient magnetic field generator 52 is provided to generate spatially linear gradient magnetic fields Gx, Gy, and Gz in the subject 9 and to induce a change in uniformity of the magnetic field.

According to an exemplary embodiment, the gradient magnetic field generator 52 may include a frequency-encoding gradient magnetic field generator 52a, a phase-encoding gradient magnetic field generator 52b, and a slice-select gradient magnetic field generator 52c as illustrated in FIG. 2.

Each of the gradient magnetic field generators 52a, 52b, and 52c generates a gradient signal according to an imaging position to differently induce resonant frequencies of parts of the subject 9. When a magnetization vector of an atomic nucleus generated by a static magnetic field rotates on a horizontal plane, a rotation frequency or phase of the magnetization vector is spatially controllable by a gradient magnetic field. In other words, each of the gradient magnetic field generators 52a, 52b, and 52c spatially encodes a magnetic resonance signal induced in the RF coil 53 so that the signal has spatial information of each of slices S1, S2, S3, etc. Accordingly, the magnetic resonance signal may be expressed by the processor 30 in a spatial frequency domain, that is, a k-space.

Each of the frequency-encoding gradient magnetic field generator 52a, the phase-encoding gradient magnetic field generator 52b, and the slice-select gradient magnetic field generator 52c may be implemented using one or more coils or magnets, which are provided to be in contact with each other, adjacent to each other, or spaced apart from each other.

The frequency-encoding gradient magnetic field generator 52a is set so that spins constituting each row have different frequencies and the frequency-encoding gradient magnetic field Gx in an X-axis direction, which distinguishes each of the spins, is generated. The frequency-encoding gradient magnetic field generator 52a may apply the frequency-encoding gradient magnetic field Gx in the X-axis direction to all or a part of the subject 9 while the RF coil 53 receives the magnetic resonance signal. Larmor frequencies of atoms inside the subject 9 are changed by the frequency-encoding gradient magnetic field Gx applied by the frequency-encoding gradient magnetic field generator 52a, and frequency-encoding is performed on the magnetic resonance signal obtained in this manner.

The phase-encoding gradient magnetic field generator 52b is set so that the phase-encoding gradient magnetic field Gy in a Y-axis direction, which causes a phase shift, is generated so that rows of the slices have different phases for phase encoding. The phase-encoding gradient magnetic field Gy may be applied to the subject 9 before the frequency-encoding gradient magnetic field Gx in the X-axis direction is applied. For example, the phase-encoding gradient magnetic field Gy may be applied to the subject 9 between applications of a plurality of RF pulses, for example, between applications of a 90 degree pulse and a 180 degree pulse, or may be applied to the subject 9 during a period between applications of the RF pulse and reception of the magnetic resonance signal. Accordingly, the phase-encoding gradient magnetic field Gy may induce only a phase change of a magnetic resonance signal which will be received so that the phase-encoding gradient magnetic field generator 52b performs phase encoding on the magnetic resonance signal. The phase-encoded magnetic resonance signal forms a line corresponding to the phase-encoding gradient magnetic field Gy in the k-space.

The slice-select gradient magnetic field generator 52c is set to generate the slice-select gradient magnetic field Gz in a Z-axis direction used to select a slice. As illustrated in FIG. 3, the slice-select gradient magnetic field Gz may be applied to the subject 9 to be gradually reduced or increased in one direction of the subject 9. The decrease or increase of the slice-select gradient magnetic field Gz may be linear. Since the slice-select gradient magnetic field Gz is applied to the subject 9 as described above, sizes of the slice-select gradient magnetic fields Gz at each point of the subject 9 is different. Since a size of a Larmor frequency is proportional to an intensity of the applied magnetic field, Larmor frequencies at each of the points of the subject 9 is also different. Accordingly, the MRI apparatus 1 may select the slices S1 to S3, etc. corresponding to each of the points of the subject 9. In this case, thicknesses of the slices S1 to S3 are determined according to a bandwidth of an RF pulse applied to the subject 9 and/or a size of the slice-select gradient magnetic field Gz.

According to an exemplary embodiment, the slice-select gradient magnetic field generator 52c may apply the slice-select gradient magnetic field Gz to the subject 9 for a short time. As described above, the application of the slice-select gradient magnetic field Gz for the short time is referred to as blips Gz1 to Gz4 (in FIG. 9) of the slice-select gradient magnetic field Gz. In a blipped-CAIPI method, the blips Gz1 to Gz4 of the slice-select gradient magnetic field Gz may be used to generate a phase difference between the slices S1 to S3. These operations will be described below.

Figure 4:
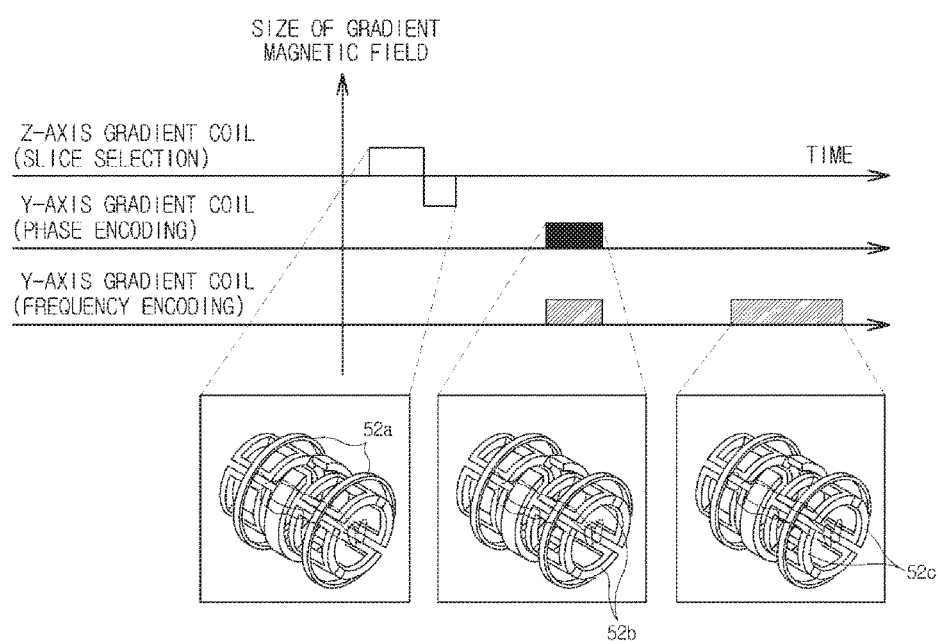
FIG. 4 is a diagram for describing an example of an operation of the gradient magnetic field generator.

FIG. 4 is a diagram for describing an example of an operation of the gradient magnetic field generator.

A pulse sequence of each of the gradient magnetic field generators 52a to 52c will be described with reference to FIG. 4. As illustrated in FIG. 4, the gradient magnetic field Gz is formed by the slice-select gradient magnetic field generator 52c in the internal room 50a in the Z-axis direction, that is, in a longitudinal direction of the mounting plate 8a. When the RF coil 53 transmits an RF pulse having a predetermined frequency in a state in which only the gradient magnetic field Gz is formed, a free induction decay (FID) signal may be generated by at least one slice. The at least one slice which generates the FID signal is a slice to which a magnetic field corresponding to a frequency range of the RF pulse is applied. Accordingly, one or more slices may be selected. However, spins of the selected slices all have the same frequency and the same phase so that distinguishing between each of the spins is difficult.

The frequency-encoding gradient magnetic field generator 52a and the phase-encoding gradient magnetic field generator 52b may form the frequency-encoding gradient magnetic field Gx and the phase-encoding gradient magnetic field Gy to identify and distinguish each of the spins of the selected slices.

The phase-encoding gradient magnetic field generator 52b forms the phase-encoding gradient magnetic field Gy in the Y-axis direction, and different phase shifts are caused in spins of each slice according to the phase-encoding gradient magnetic field Gy. In other words, after a Y-axis gradient magnetic field is formed, spins having a relatively large gradient magnetic field are changed to have phases having a high frequency, and spins having a relatively small gradient magnetic field are changed to have phases at a low frequency. When the Y-axis gradient magnetic field is blocked, all of the spins perform precession at a predetermined frequency, but a permanent phase change is caused by the Y-axis gradient magnetic field so that each of the spins may be identified.

While the FID signal is obtained, the frequency-encoding gradient magnetic field generator 52a may apply the frequency-encoding gradient magnetic field Gx to the subject 9. When the slices are represented by a predetermined matrix, the frequency-encoding gradient magnetic field Gx in the X-axis direction may make spins constituting each row have difference frequencies so that each of the spins may be distinguished.

The RF coil 53 is provided to apply an RF signal to the subject 9 and/or receive a magnetic resonance signal induced in the subject 9, for example, an FID signal. For example, the RF coil 53 may transmit an RF signal having the same frequency as a frequency of precession toward an atomic nucleus which performs precession to the subject 9. Further, as an electrical signal caused by a magnetization vector of the atomic nucleus is induced in each coil of the RF coil 53, the RF coil 53 may receive a magnetic resonance signal emitted from the subject 9. In this case, the received magnetic resonance signal is a phase-encoded or frequency-encoded signal according to the application of the gradient magnetic field of the above-described gradient magnetic field generator 52 for each of the slices S1, S2, and S3.

According to an exemplary embodiment, the RF coil 53 may separately include a transmitting RF coil for generating an electromagnetic wave (an RF pulse) having a predetermined frequency corresponding to a type of an atomic nucleus, and a receiving RF coil for receiving an electromagnetic wave (a magnetic resonance signal) emitted from the atomic nucleus. According to another exemplary embodiment, the RF coil 53 may include an RF transmitting and receiving coil which may perform both functions of transmitting an RF pulse and receiving a magnetic resonance signal. The RF transmitting and receiving coil may include a phase array coil.

According to an exemplary embodiment, the RF coil 53 may be provided inside the MRI apparatus 1, as illustrated in FIG. 1. According to another exemplary embodiment, the RF coil 53 may be mounted throughout the subject 9 or on a part of the subject 9. When the RF coil 53 is mounted throughout the subject 9 or on a part of the subject 9, the RF coil 53 may be divided into a head coil, a spine coil, a torso coil, and/or a knee coil according to an imaging part or a mounting part.

In some exemplary embodiments, the RF coil 53 may be implemented using a plurality of coil elements which overlap or are spaced apart from each other, and each of the coil elements may be provided to have a loop structure which is implemented in various shapes such as a circular shape, an elliptical shape, a tetragonal shape, a hexahedral shape, and the like.

The magnetic resonance signal induced in the RF coil 53 may be directly transferred to the processor 30 or may be temporarily or permanently stored in a separately provided storage 40 and then transferred to the processor 30. The processor 30 may generate at least one k-space for each of the slices S1, S2, and S3 by filling at least a two-dimensional space with the received magnetic resonance signal. When the k-space is generated, the processor 30 may convert the generated k-space to generate a magnetic resonance image, and the generated magnetic resonance image may be stored in the storage 40 or may be displayed to the user through the output interface 13.

Hereinafter, the blipped-CAIPI method will be described.

The blipped-CAIPI method is a type of simultaneous multi-slice (SMS) imaging method. The blipped-CAIPI method may also be applied to an echo planar imaging (EPI) method.

Figure 5:
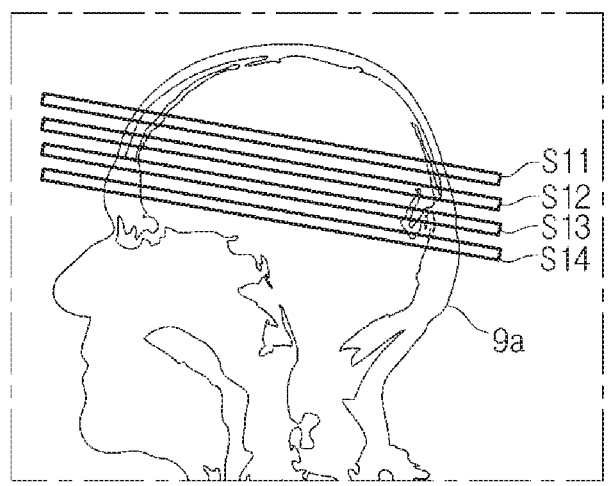
FIG. 5 is a diagram illustrating a plurality of slices for describing the blipped-CAIPI method.
Figure 6:
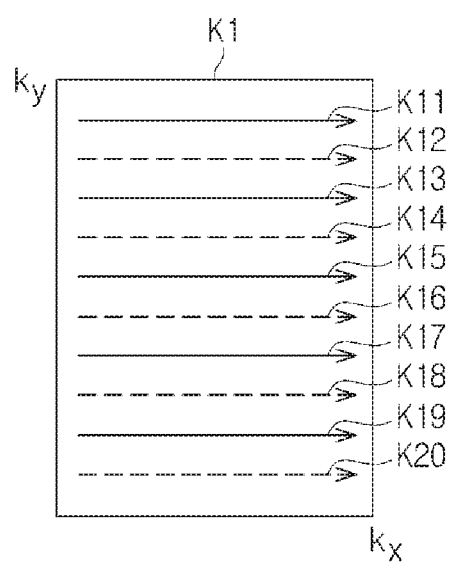
FIG. 6 is a diagram for describing an example of undersampling.

FIG. 5 is a diagram illustrating a plurality of slices for describing the blipped-CAIPI method, and FIG. 6 is a diagram for describing an example of undersampling.

A parallel imaging method is a method in which data may be more rapidly obtained by allowing each coil element to simultaneously receive data from the subject 9 in parallel.

For example, as illustrated in FIG. 5, when the head 9a of a human body is imaged, a plurality of slices S11 to S14 may be set and selected in the head 9a according to an application of a slice-select gradient magnetic field as described above. When the RF coil 53 applies an RF pulse to the head 9a, a signal corresponding to a Larmor frequency flows through the RF coil 53. In this case, in the parallel imaging method, each of the coil elements of the RF coil 53 simultaneously receives data from the head 9a.

When not enough signals are obtained for the Nyquist sampling theorem, aliasing, in which signals of a magnetic resonance image overlap, may occur. The processor 30 may perform image restoration by identifying pieces of data based on local sensitivity of each of the coil elements in order to avoid the occurrence of aliasing. In this case, the processor 30 may read, for example, a sensitivity map (a sensitivity profile) stored in the storage 40, obtain and determine the local sensitivity of each of the coil elements based on the sensitivity map, and determine a value of a target pixel or target voxel using the obtained local sensitivity of each of the coil elements and an aliased pixel or an aliased voxel. The processor 30 may obtain an image from which aliasing is removed by generating an image on the basis of the determined target pixel or target voxel.

In the process of performing the parallel imaging method, the processor 30 may perform undersampling on a k-space K1 so that data is rapidly obtained by relatively reducing an amount of pieces of data used for image generation. Such undersampling may be uniformly performed on the k-space K1. For example, the undersampling for the k-space K1 may be performed by sampling only some phase-encoding lines K11, K13, K15, K17, and K19 of phase-encoding lines K11 to K20, as illustrated in FIG. 6. Specifically, for example, when data is sampled from any one of the phase-encoding lines K11 to K20, for example, the first phase-encoding line K11, data is not sampled from the next phase-encoding line, for example, the second phase-encoding line K12, and data is then sampled from the next phase-encoding line, for example, the third phase-encoding line K13. In this manner, the processor 30 may sample data from only specific phase-encoding lines, for example, the odd-numbered phase-encoding lines K11, K13, K15, K17, and K19 or the even-numbered phase-encoding lines K12, K14, K16, K18, and K20. In this case, the processor 30 restores the image by further using sensitivity of each of the coil elements in order to compensate for the missed phase-encoding lines K12, K14, K16, K18, and K20.

In such an image restoration process, a signal-to-noise ratio (SNR) may be reduced. Therefore, in the CAIPI method, an RF pulse having a different phase from a phase which is applied to specific slices, for example, a first slice S11 and a third slice S13, is applied to other slices, for example, a second slice S12 and a fourth slice S14.

Figure 7:
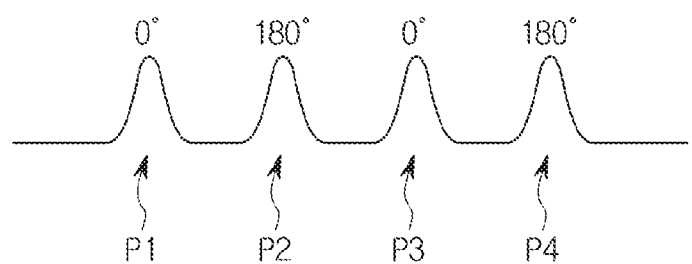
FIG. 7 is a diagram illustrating an example of an RF pulse applied to a subject to perform a CAIPI method.

For example, as illustrated in FIG. 7, in a case in which an acceleration factor is 2 (af=2), when magnetic resonance signals are obtained from the first slice S11 and the third slice S13, RF pulses P1 and P3 having a 0 degree phase are applied to a subject, for example, the head 9a, and when magnetic resonance signals are obtained from the second slice S12 and the fourth slice S14, RF pulses having a different phase, for example, RF pulses P2 and P4 having a 180 degree phase, may be applied to the head 9a. In other words, a phase of the first RF pulse P1 applied by the RF coil 53 to obtain data on one slice, for example, the first slice S11, is set to be different from a phase of the second RF pulse P2 applied by the RF coil 53 to obtain data on the next slice, for example, the second slice S12. The RF coil 53 may apply the first RF pulse P1 and the second RF pulse P2 to the head 9a by intersecting the first RF pulse P1 and the second RF pulse P2.

Although a pattern in which the RF pulses P1 and P2 having two different phases are alternately applied to the head 9a is illustrated in FIG. 7, a pattern of RF pulses applied to the head 9a is not limited thereto. A pattern of phases of the applied RF pulses may be defined in various forms according to a selection or design of a designer. For example, the acceleration factor may be defined as 4 other than 2. When the acceleration factor is defined as 4 (af=4), phases of RF pulses may be respectively set to 0 degrees, 90 degrees, 180 degrees, and 270 degrees so that the RF pulses having four different phases may be applied to the head 9a in a predetermined order.

Figure 8:
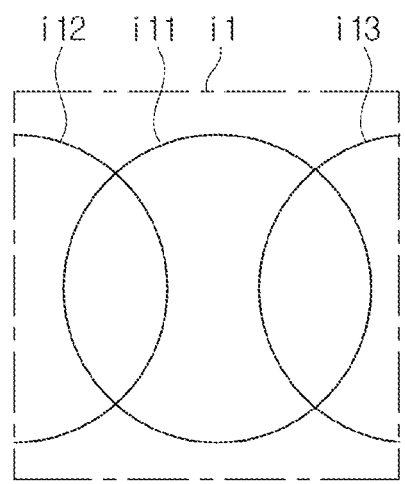
FIG. 8 is a diagram for describing slices moved according to a phase difference between RF pulses in the CAIPI method.

When the acceleration factor is given as 2 and the RF pulses having different phases are applied to the second slice S12 and the fourth slice S14 in a phase encoding direction, as described above, images corresponding to the second slice S12 and the fourth slice S14 are shifted within a field of view (FOV), as illustrated in FIG. 8. In other words, image aliasing may occur.

That is, an image i11 of the subject corresponding to the first slice S11 and the third slice S13 to which the RF pulses P1 and P3 having a 0 degree phase are applied is located at a center of an FOV i1, and images i12 and i13 of the subject corresponding to the second slice S12 and the fourth slice S14 to which the RF pulses p2 and p4 having a 180 degree phase are applied are shifted by half thereof and displayed. In other words, the images i12 and i13 of respective halves of the subject corresponding to the second slice S12 and the fourth slice S14 are displayed separately. Therefore, the second slice S12 and the fourth slice S14 may be distinguished from the first slice S11 and the third slice S13.

When the RF pulses P1 to P4 having multiple phases are applied to the subject, for example, the head 9a, as described above, the processor 30 may restore the images using both the sensitivity of the coil elements and the phase encoding direction.

According to an exemplary embodiment, when restoring images using the sensitivity of the coil element and the phase encoding direction, the processor 30 may use various methods. For example, the processor 30 may use a sensitivity encoding (SENSE) method to restore and obtain a desired magnetic resonance image in an image region or may use a generalized autocalibrating partially parallel acquisition (GRAPPA) method to restore and obtain a desired magnetic resonance image in a k-space region. At least one of the SENSE method and the GRAPPA method may be used in the case of simply using a parallel imaging method to restore a magnetic resonance image and may be used in the case of using a CAIPI method to restore a magnetic resonance image.

FIG. 9 is a diagram illustrating an example of a pattern of magnetic field blips applied to a subject to perform a blipped-CAIPI method.

The blipped-CAIPI method may be performed as the slice-select gradient magnetic field generator 52c applies the slice-select gradient magnetic field Gz to the subject 9 for a short time, as illustrated in FIG. 9.

The blips Gz1 to Gz4 of the slice-select gradient magnetic field Gz may be applied to the subject, for example, the head 9a, in the middle of a process in which the RF coil 53 obtains a magnetic resonance signal. Phase differences are generated between the slices S11 to S14 due to the application of the blips Gz1 to Gz4 of the slice-select gradient magnetic field Gz.

In this case, the phase differences generated by the blips Gz1 to Gz4 may be determined by positions of the slices S11 to S14 and moments of the blips Gz1 to Gz4 of the slice-select gradient magnetic field Gz.

As described above, the processor 30 may restore images using the phase differences between the slices S11 to S14. Specifically, since all or some of the slices S11 to S14 have different phases so that the slices S11 to S14 may be identified using the phases thereof, the processor 30 may use an image restoration method, such as the above-described SENSE method or GRAPPA method, based on the phase differences between each of the slices S11 to S14 to restore the magnetic resonance image corresponding to the plurality of slices S11 to S14.

For example, the image restoration method may be simultaneously performed on the blips Gz1 to Gz4 of the slice-select gradient magnetic field Gz and blips of a phase-encoding gradient magnetic field Gy.

When blipped echo planar imaging (blipped EPI) is performed, the phase-encoding gradient magnetic field generator 52b of the MRI apparatus 1 may operate to apply the phase-encoding gradient magnetic field Gy to the subject 9 for a short time. The blipped EPI is performed in blips Gy1, Gy2, Gy3, and Gy4 of the phase-encoding gradient magnetic field Gy multiple times. For example, as illustrated in FIG. 9, when the frequency-encoding gradient magnetic field Gx is repeatedly applied to the subject 9 in a predetermined pattern (Gx1, Gx2, and Gx3), the phase-encoding gradient magnetic field generator 52b may set the frequency-encoding gradient magnetic field Gx to be shortly applied to the subject 9 during a time point at which a size of the frequency-encoding gradient magnetic field Gx is 0. In this case, a k-space is filled with magnetic resonance signals in a zigzag form.

The above-described blips Gz1 to Gz4 of the slice-select gradient magnetic field Gz may be applied to the subject 9 at the same time as, for example, a time point at which the blips Gy1 to Gy4 of the phase-encoding gradient magnetic field Gy are applied to the subject 9.

The blips Gz1 to Gz4 of the slice-select gradient magnetic field Gz may be applied to the subject 9 in a predetermined pattern. The application pattern of the blips Gz1 to Gz4 may be defined in various forms according to a selection of a designer. For example, the blip Gz1 of the slice-select gradient magnetic field Gz applied to the subject 9 at any one phase-encoding line, for example, a first phase-encoding line, and the blip Gz2 of the slice-select gradient magnetic field Gz applied to the subject 9 at the next phase-encoding line, for example, a second phase-encoding line, may be set to be inverted. In other words, the blip Gz2 of the slice-select gradient magnetic field Gz may be inverted for each phase-encoding line and applied to the subject 9.

A balancing blip Gz0 may be applied to the subject 9 before the applied blips Gz1 to Gz4 of the slice-select gradient magnetic field Gz are applied to the subject 9.

Figure 10:
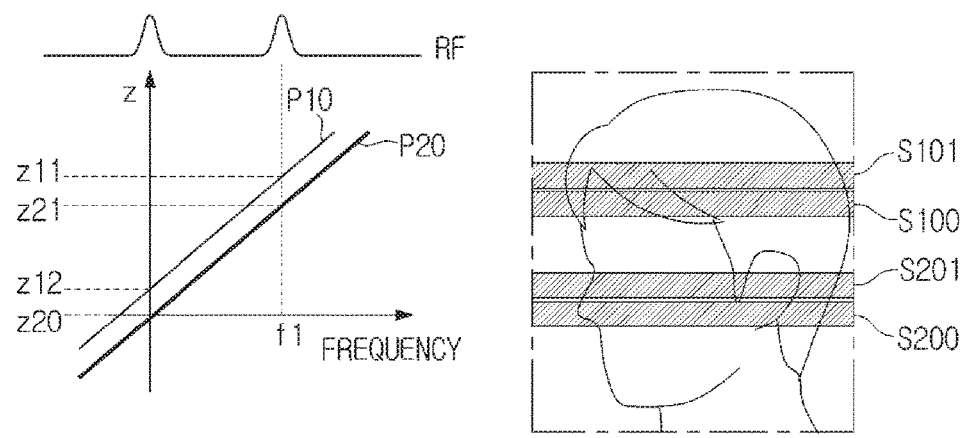
FIG. 10 is a diagram for describing an excitation position error of a chemical shift material generated in the process of performing the blipped-CAIPI method.
Figure 11:
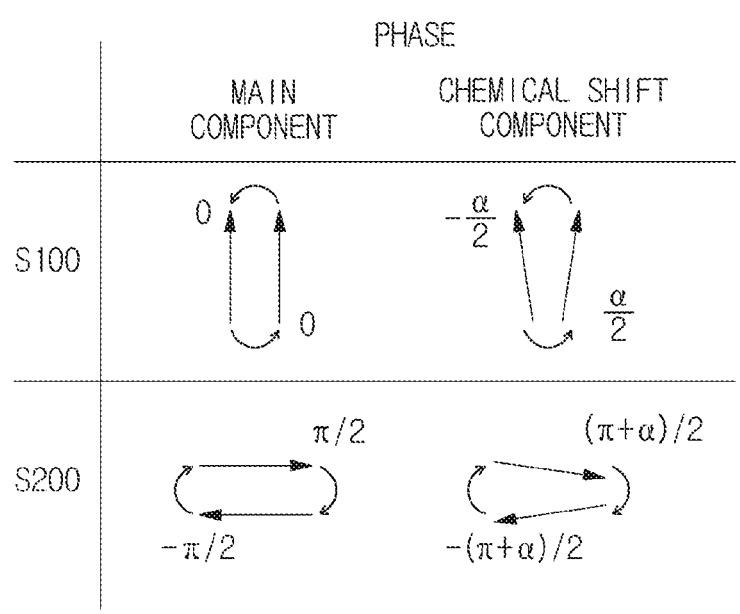
FIG. 11 is a table for describing a phase difference between a main component and a chemical shift component in each of a first slice and a second slice.

FIG. 10 is a diagram for describing an excitation position error of a chemical shift material generated in the process of performing the blipped-CAIPI method. In FIG. 10, an X-axis denotes a frequency of an RF signal and a Z-axis denotes an excitation position. Further, in FIG. 10, a line segment P10 illustrates a relationship between a frequency of a chemical shift component, for example, fat, and an excitation position thereof, and a line segment P20 illustrates a relationship between a frequency of a main component, for example, water, and an excitation position thereof. FIG. 11 is a table for describing a phase difference between a main component and a chemical shift component in each of a first slice and a second slice.

A main component and a chemical shift component exist together in a subject, for example, in the head 9a. The main component refers to a material having an intended resonant frequency in a region intended to be imaged. For example, when it is intended to image the head 9a of a human body, the main component may be water. The chemical shift component refers to a material of which a resonant frequency of an atomic nucleus is different from a resonant frequency of an atomic nucleus of the main component. The chemical shift component may be, for example, fat. A difference exists between a chemical environment of each molecule in the chemical shift component and a chemical environment of each molecule in the main component. Due to the above difference, a resonant frequency difference exists between the chemical shift component and the main component.

When both the main component and the chemical shift component exist in the region intended to be imaged, for example, in the head 9a, while performing the blipped-CAIPI method, a difference exists between the resonant frequency of the chemical shift component and the resonant frequency of the main component, and the difference causes a geometric error at an excitation position in a selection direction of the slice. Accordingly, quality of the obtained magnetic resonance image may be degraded.

Specifically, when the blips Gz1 to Gz4 of the slice-select gradient magnetic field Gz are applied to the head 9a, phase differences are generated between the slices. When a gradient magnetic field blip is applied to the head 9a and an RF pulse having a predetermined frequency f1 is applied to the head 9a, a magnetic resonance signal having an appropriate phase may be obtained at an appropriate position z21 in the main component.

However, when the chemical shift component, for example, fat, exists in the head 9a, the chemical shift component has a different resonant frequency from the main component so that a phase error may be caused, as illustrated in FIG. 10.

Specifically, when an RF signal having a predetermined frequency f1 is applied to the head 9a in a state in which the blips Gz1 to Gz4 of the slice-select gradient magnetic field Gz are applied to the head 9a, geometric excitation positions z11 and z12 of the chemical shift component may be different from excitation positions z21 and z22 of the main component. Accordingly, the chemical shift component is located at slices S101 and S201, which are different from slices S100 and S200 at which the main component is located, and magnetic resonance signals are collected.

In other words, as illustrated in FIG. 11, while performing the blipped-CAIPI method, although a phase of a main component in the first slice S100, for example, a phase of water, is changed as desired (e.g., 0 degree), a phase of a chemical shift component in the first slice S100, for example, a phase of fat, is changed due to a difference between resonant frequencies thereof, and the chemical shift component has a different phase from the main component, for example, a phase of $-\alpha/2$ or $\alpha/2$ ($\alpha>0$). That is, an error occurs in the phase of the chemical shift component.

In the same manner, in the case of the second slice S200, a phase of the main component in the second slice S200 is changed to, for example, a 90 degree or $-90$ degree by the blips Gz1 to Gz4 of the slice-select gradient magnetic field Gz, and the chemical shift component in the second slice S200 has a different phase from the main component thereof, for example, a phase of $(\pi-\alpha)/2$ to $(\pi+\alpha)/2$.

Figure 12:
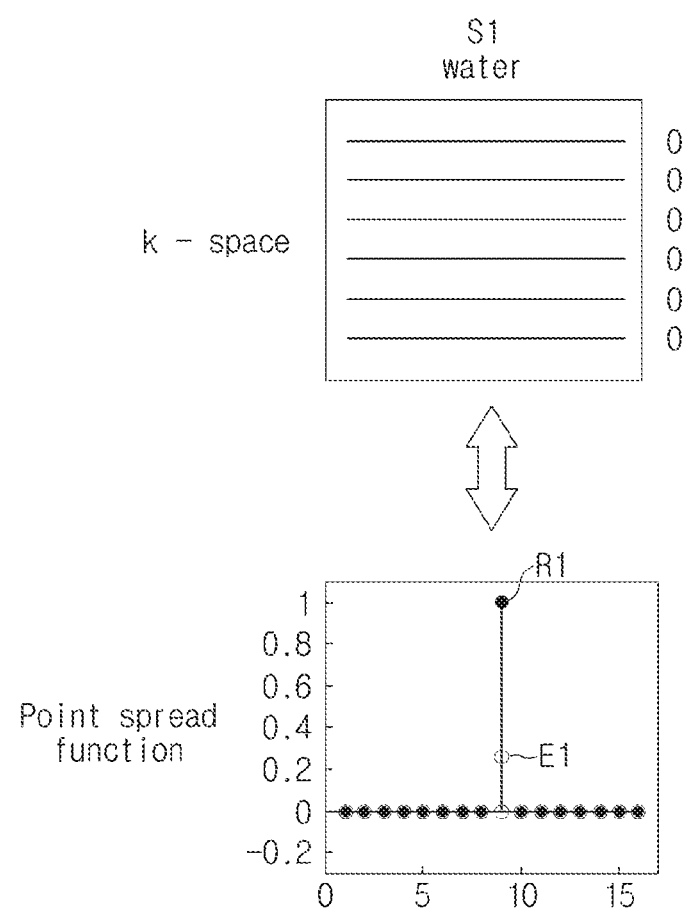
FIG. 12 is a diagram illustrating an example of a point spread function with respect to a main component in a first slice.
Figure 13:
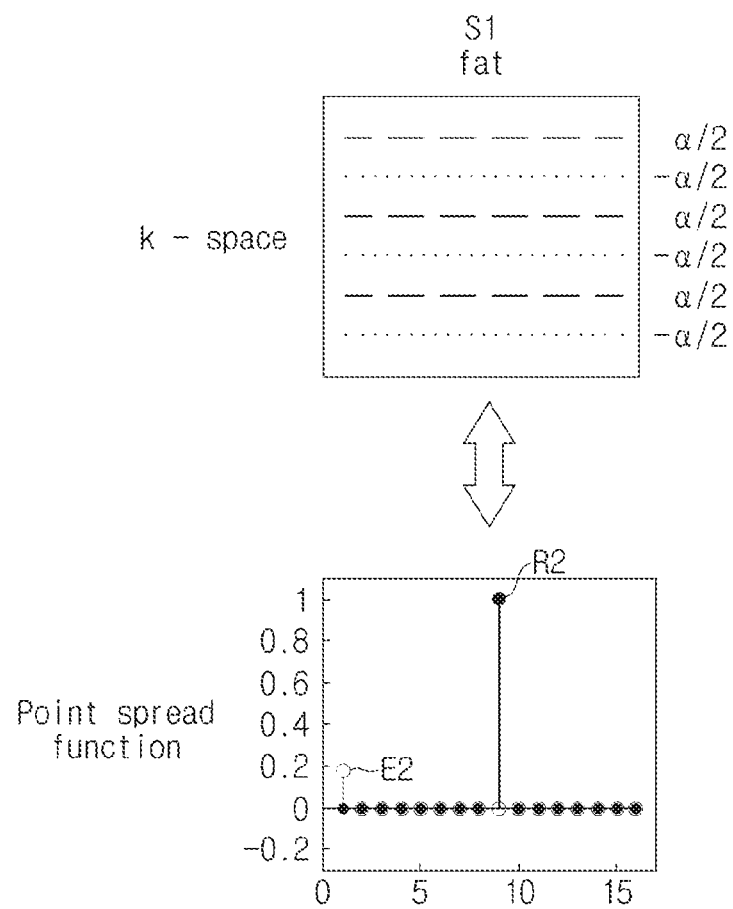
FIG. 13 is a diagram illustrating an example of a point spread function with respect to a chemical shift component in the first slice.

FIG. 12 is a diagram illustrating an example of a point spread function with respect to a main component in a first slice and FIG. 13 is a diagram illustrating an example of a point spread function with respect to a chemical shift component in the first slice. In FIGS. 12 and 13, each upper part represents a k-space and each lower part represents a point spread function corresponding to the k-space. The number next to each of phase-encoding lines of the k-space represents a phase.

Specifically, as illustrated in FIG. 12, in the main component, each of the phase-encoding lines of the k-space is filled with a magnetic resonance signal having a 0 degree phase. Accordingly, a point spread function R1 with respect to the main component substantially matches a point spread function E1 with respect to the main component in an image.

As illustrated in FIG. 13, in the chemical shift component, each of the phase-encoding lines of the k-space is filled with a magnetic resonance signal having a different phase, for example, a phase having an error of $-\alpha/2$ or $\alpha/2$. Accordingly, a point spread function R2 with respect to the chemical shift component may mismatch a point spread function E2 with respect to the chemical shift component in an image. That is, the point spread function R2 with respect to the chemical shift component and the point spread function E2 with respect to the chemical shift component in the image may be spaced a certain degree from each other.

Therefore, as described above, the phase error of the chemical shift component appears as artifacts a1 and a2 (in FIG. 15) on the obtained magnetic resonance image in the image.

Figure 14:
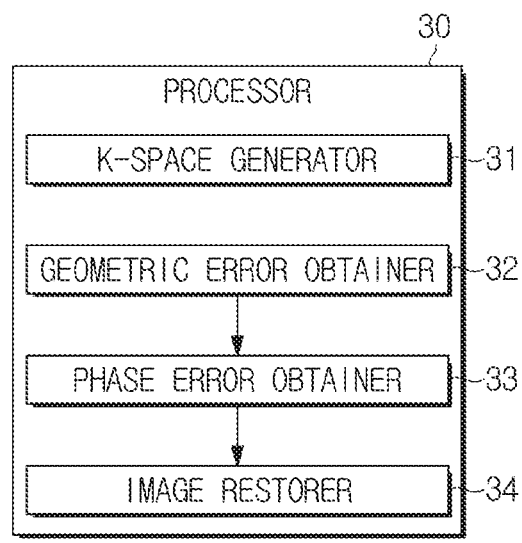
FIG. 14 is a block diagram illustrating an exemplary embodiment of a processor.

FIG. 14 is a block diagram illustrating an exemplary embodiment of a processor.

The processor 30 may calculate a phase error $\alpha$ of a chemical shift component in order to correct or remove artifacts in a magnetic resonance image due to such a phase error $\alpha$ of the chemical shift component.

As illustrated in FIG. 14, in an exemplary embodiment, the processor 30 may include a k-space generator 31, a geometric error obtainer 32, a phase error obtainer 33, and an image restorer 34. The k-space generator 31, the geometric error obtainer 32, the phase error obtainer 33, and the image restorer 34 may be physically or logically divided. When the k-space generator 31, the geometric error obtainer 32, the phase error obtainer 33, and the image restorer 34 are physically divided, each of the geometric error obtainer 32, the phase error obtainer 33, and the image restorer 34 may be implemented by a separate device which is physically divided, for example, by a semiconductor chip. When the k-space generator 31, the geometric error obtainer 32, the phase error obtainer 33, and the image restorer 34 are logically divided, each of the geometric error obtainer 32, the phase error obtainer 33, and the image restorer 34 may be implemented by one or more devices.

The k-space generator 31 generates a k-space on the basis of a magnetic resonance signal transmitted from the RF coil 53. For example, the k-space generator 31 may receive magnetic resonance signals induced due to resonance of an atomic nucleus with respect to applied RF pulses of a main component and a chemical shift component and generate the k-space by disposing the received magnetic resonance signals at positions of the k-space according to the encoded phase and frequency.

The geometric error obtainer 32 may obtain a geometric error $z_f$ in a slice selection process.

According to an exemplary embodiment, the geometric error obtainer 32 may calculate and obtain the geometric error $z_f$ using the following Equation 1.

$$z_{cs} = \frac{f_{cs}}{\gamma G_{ss}} \quad \text{[Equation 1]}$$

Here, $Z_{cs}$ denotes a geometric error and $\gamma$ denotes a gyromagnetic ratio. The gyromagnetic ratio $\gamma$ may be defined as a ratio of a magnetic moment to each angular momentum by spins of an atomic nucleus. $f_{cs}$ denotes a resonant frequency difference between a main component and a chemical shift component. The resonant frequency difference $f_{cs}$ between the main component and the chemical shift component may be experimentally or empirically obtained. $G_{ss}$ denotes a size of the slice-select gradient magnetic field Gz. In other words, the geometric error $Z_{cs}$ is determined in proportion to the resonant frequency difference between the main component and the chemical shift component inside the subject 9.

A result of calculation by the geometric error obtainer 32, that is, the geometric error $Z_{cs}$, may be transferred to the phase error obtainer 33.

The phase error obtainer 33 may calculate the phase error ($\alpha$) of the chemical shift component. In some exemplary embodiments, the phase error obtainer 33 may use the transferred geometric error $Z_{cs}$ to calculate the phase error $\alpha$ of the chemical shift component.

According to an exemplary embodiment, the phase error obtainer 33 may use the following Equation 2 to calculate the phase error $\alpha$ of the chemical shift component.

$$\alpha = 2\pi \gamma G_b T_b z_{cs} \quad \text{[Equation 2]}$$

In Equation 2, $\alpha$ denotes a phase error of the chemical shift component, $\gamma$ denotes a gyromagnetic ratio, $G_b$ denotes a size of each of the applied blips Gz1 to Gz4 of the gradient magnetic field, and $T_b$ denotes a time at which each of the blips Gz1 to Gz4 of the gradient magnetic field is applied to a subject. $Z_{cs}$ denotes a geometric error calculated by Equation 1.

The gyromagnetic ratio $\gamma$ may be calculated using a magnetic moment for each angular momentum by spins of an atomic nucleus as described above, the size $G_b$ of each of the blips Gz1 to Gz4 of the gradient magnetic field or the time $T_b$ at which each of the blips Gz1 to Gz4 of the gradient magnetic field is applied to the subject is a variable which is determined according to a manipulation of a user or a predefined setting, the geometric error $Z_{cs}$ is calculated by the geometric error obtainer 32 so that the phase error obtainer 33 may use the given values to calculate the phase error $\alpha$ of the chemical shift component without a separate measurement process.

Equation 2 may be expressed as the following Equation 3 by substituting the above-described Equation 1.

$$\alpha = \frac{2\pi f_{cs} G_b T_b}{G_{ss}} \quad \text{[Equation 3]}$$

As described above, since all the resonant frequency difference $f_{cs}$ between the main component and the chemical shift component, the size $G_b$ of each of the blips Gz1 to Gz4 of the gradient magnetic field, the time $T_b$ at which each of the blips Gz1 to Gz4 of the gradient magnetic field is applied to the subject, and the size $G_{ss}$ of the slice-select gradient magnetic field Gz are given values, the phase error obtainer 33 may use the given values of these variables to calculate the phase error $\alpha$ of the chemical shift component.

When the phase error obtainer 33 uses the above-described Equation 3 to calculate the phase error $\alpha$, the calculation of the geometric error $z_f$ may be omitted, and thus the geometric error obtainer 32 may also be omitted.

When the phase error $\alpha$ of the chemical shift component is calculated as described above, the calculation result is transferred to the image restorer 34.

The image restorer 34 may restore an image using the transferred phase error $\alpha$ of the chemical shift component.

According to an exemplary embodiment, the image restorer 34 may determine final data by the phase error $\alpha$ of the chemical shift component being reflected in the above-described SENSE method or GRAPPA method, and restore an image based on the final data.

When the image restorer 34 uses the SENSE method, an image from which artifacts are removed may be obtained, for example, using the following Equation 4.

$$\rho_s = \underset{\rho}{\operatorname{argmin}} \|s - \Theta \Phi \Psi F C \rho\|_2^2 + \lambda \|\nabla \rho\|_1 \qquad \text{[Equation 4]}$$

Here, $\rho$ on the right side in Equation 4 denotes a vector concatenation of pieces of data of a main component and a chemical shift component of each of a plurality of slices, and s denotes k-space data obtained by the k-space generator 31.

$\Theta$, $\phi$, and $\psi$ are operators in pixel units, wherein $\Theta$ is a phase error operator for the phase error $\alpha$ being reflected in the vector concatenation $\rho$ of the pieces of data of the main component and the chemical shift component, $\phi$ is a gradient magnetic field phase reflection operator for a phase generated by the gradient magnetic field blip being reflected in the process of performing blipped-CAIPI on the vector concatenation $\rho$ of the pieces of data of the main component and the chemical shift component, and $\psi$ is a chemical shift phase reflection operator for a phase error due to chemical shift being reflected in the vector concatenation $\rho$ of the pieces of data of the main component and the chemical shift component.

In some exemplary embodiments, at least one of the chemical shift phase reflection operator $\phi$ and the chemical shift phase reflection operator $\psi$ may be omitted.

Each of $\Theta$, $\phi$, and $\psi$ may be expressed in the form of the following Equation 5.

$$\text{voxel}_{output} = \text{voxel}_{input} \cdot \exp(-j\theta) \qquad \text{[Equation 5]}$$

Here, $\text{voxel}_{input}$ denotes an input value in each voxel. In some exemplary embodiments, $\text{voxel}_{input}$ may be defined as an input value in each pixel. J is a predefined constant, and $\theta$ is a value defined differently for each operator.

In the case of the phase error operator $\Theta$, $\theta$ is defined as the phase error $\alpha$. In other words, in the case of the operator $\Theta$ for the phase error $\alpha$ being reflected in the vector concatenation $\rho$ of the pieces of data of the main component and the chemical shift component, the above-described Equation 5 may be expressed as the following Equation 6.

$$\text{voxel}_{output} = \text{voxel}_{input} \cdot \exp(-j\alpha) \qquad \text{[Equation 6]}$$

In the case of the gradient magnetic field phase reflection operator $\phi$, $\theta$ in Equation 5 may be given as $\gamma \ast G_b \ast T_b \ast z$ with respect to a position z of a slice. In other words, $\theta$ may be given by the product of the gyromagnetic ratio, the size of each of the gradient magnetic field blips Gz1 to Gz4, and the application time and position of each of the gradient magnetic field blips Gz1 to Gz4.

In the case of the chemical shift phase reflection operator $\psi$, $\theta$ in Equation 5 may be expressed as $2\pi f_{cs} t$ with respect to an obtained time t of an EPI line. In other words, $\theta$ in Equation 6 may be given as a value proportional to the product of the resonant frequency difference between the main component and the chemical shift component and the time.

$\text{voxel}_{output}$ denotes the calculation result.

Further, on the right side in Equation 4, F denotes a Fourier transform operator for performing a Fourier transform on each of the main component and the chemical shift component, and C denotes a coil sensitivity operator for sensitivity of each coil element being reflected in the vector concatenation $\rho$ of the pieces of data of the main component and the chemical shift component. In some exemplary embodiments, the coil sensitivity operator C may be omitted. In this case, $C\rho$ is a vector concatenation of magnetic resonance signals output from each of the coil elements for each of the main component and the chemical shift component. $C\rho$ increases in proportion to the number of coil elements, and as the number of coil elements increases, a dimension thereof approaches that of the actually obtained k-space data (s).

$\rho_s$ on a left side in Equation 4 is final data intended to be obtained.

Referring to Equation 4, after sensitivity of each coil element is reflected in each of a plurality of vector concatenations $\rho$, a Fourier transform is performed on the vector concatenation $C\rho$ in which the sensitivity of each of the coil elements is reflected. Each of the operators $\Theta$, $\phi$, and $\psi$ are then applied to the result of performing the Fourier transform. Each of the plurality of calculation results obtained by the operators $\Theta$, $\phi$, and $\psi$ being reflected in the result of the Fourier transform is compared to the k-space data s, and the calculation result having the smallest difference from the k-space data s among the plurality of calculation results is determined. In this case, the vector concatenation $\rho$ corresponding to the determined result is determined as final data $\rho_s$.

The calculation by Equation 4 may be sequentially and repeatedly performed for each vector concatenation $\rho$.

Since the final data $\rho_s$ obtained in this manner is a vector concatenation of the pieces of data of the main component and the chemical shift component, the final data $\rho_s$ may be a magnetic resonance image intended to be obtained. As a result, the processor 30 may obtain a magnetic resonance image in which artifacts due to the phase error of the chemical moving component are all or mostly removed.

In some exemplary embodiments, as illustrated in Equation 4, $\lambda \|\nabla \rho\|$ may be added to the right side of Equation 4 in order to obtain the final data $\rho_s$. Here, $\lambda$ denotes a regularization parameter and $\nabla$ denotes a gradient operator. The regularization parameter $\lambda$ may be experimentally determined. $\lambda \|\nabla \rho\|$ is used to further add a total variation to the calculation result and is used to determine the final data $\rho_s$ by an amount of change of the data of the main component and the data of the chemical shift component being reflected therein. An error of the final data $\rho_s$ obtained due to the addition of the total variation may be relatively further reduced. The addition of $\lambda \|\nabla \rho\|$ may be omitted.

Figure 15:
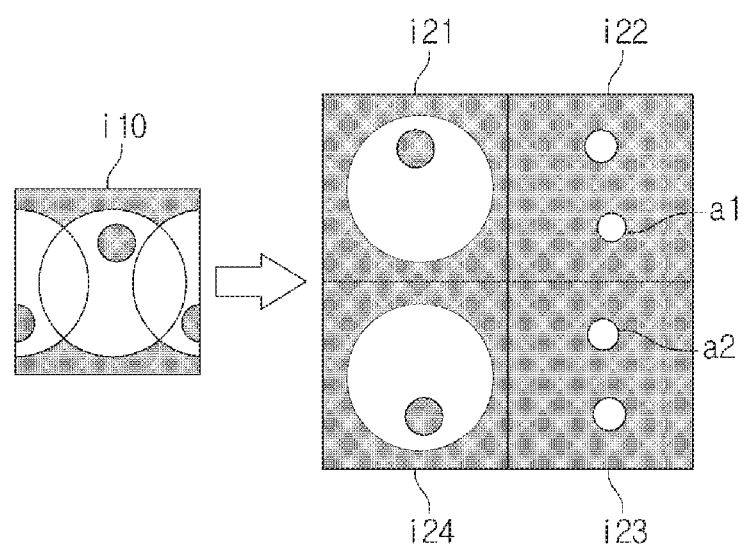
FIG. 15 is a diagram illustrating an example of an image when an excitation position error of a chemical shift component is not corrected.
Figure 16:
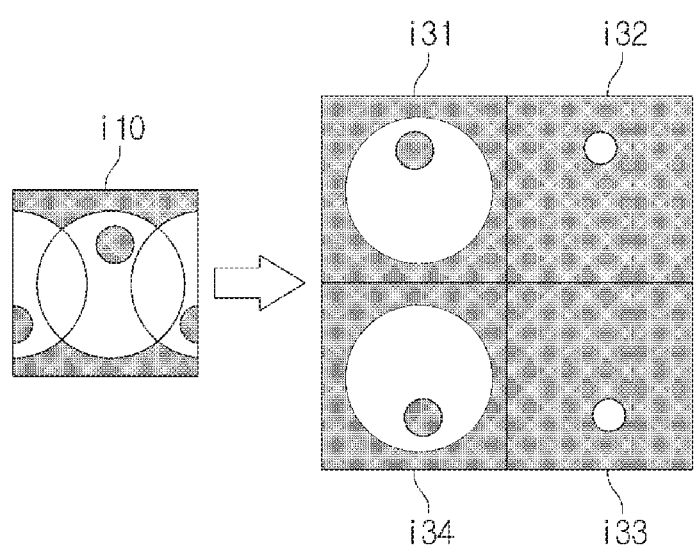
FIG. 16 is a diagram illustrating an example of an image when an excitation position error of a chemical shift component is corrected.

FIG. 15 is a diagram illustrating an example of an image when an excitation position error of a chemical shift component is not corrected, and FIG. 16 is a diagram illustrating an example of an image when an excitation position error of a chemical shift component is corrected. An image i10 on the left side of each of FIGS. 15 and 16 is obtained data, and images i21 to i24 and i31 to i34 on the right sides thereof are obtained by separating images of a plurality of slices from data obtained using a SENSE method.

FIG. 15 illustrates the images i21 to i24 obtained when the above-described phase error α of the chemical shift component is not corrected, and the images i21 to i24 located in the right side include the image i21 of the main component in the first slice S11, the image i21 of the chemical component in the first slice S11, the image i23 of the chemical shift component in the second slice S12, and the image i24 of the main component in the second slice S12, in a clockwise direction from an upper left side.

Further, FIG. 16 illustrates the images i31 to i34 obtained when the above-described phase error α of the chemical shift component is corrected, and the images i31 to i34 located on the right side include the image i31 of the main component in the first slice S11, the image i32 of the chemical shift component in the first slice S11, the image i33 of the chemical shift component in the second slice S12, and the image i34 of the main component in the second slice S12, in the clockwise direction from an upper left side.

As illustrated in FIGS. 15 and 16, there are no artifacts in the image of the main component of each of the first slice S11 and the second slice S12 regardless of whether the phase error (α) of the chemical shift component is reflected or not.

When the phase error α of the chemical shift component is not reflected, the artifacts a1 and a2 that do not actually exist may be generated on the images i22 and i23 of the chemical shift component, as illustrated in FIG. 15.

However, when the image is restored by the phase error α of the chemical shift component being reflected therein according to the above-described method, there are no artifacts in the images i32 and i33 of the chemical shift component, as illustrated in FIG. 16, and thus a magnetic resonance image which is the same as or similar to an actual tissue distribution inside the subject 9 may be obtained.

Accordingly, when the blipped-CAIPI method is performed, generation of artifacts may be prevented in the images according to the chemical shift component.

Hereinafter, an exemplary embodiment of a method of controlling an MRI apparatus will be described with reference to FIG. 17.

Figure 17:
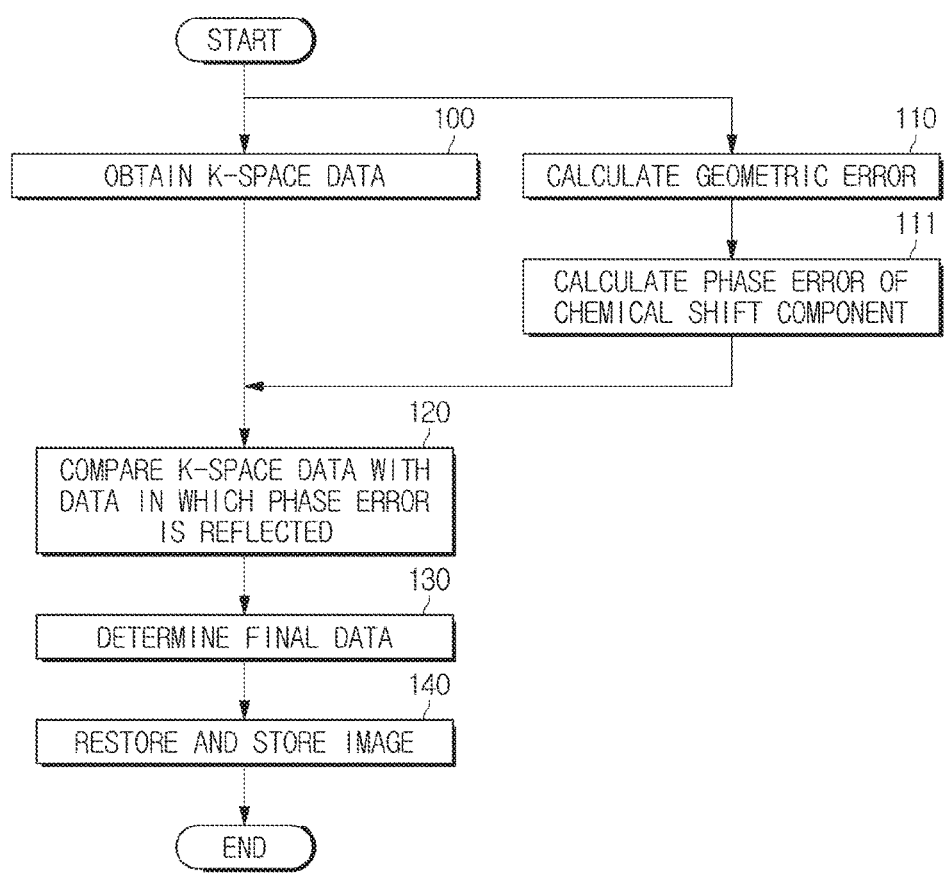
FIG. 17 is a flowchart of an exemplary embodiment of the method of controlling an MRI apparatus.

FIG. 17 is a flowchart of an exemplary embodiment of the method of controlling an MRI apparatus.

Referring to FIG. 17, the MRI apparatus 1 may obtain k-space data on the subject 9 in operation 100. In this case, the MRI apparatus 1 may apply blips of the slice-select gradient magnetic field Gz to the subject 9 using a blipped-CAIPI method so that a phase difference occurs between the slices and then obtain the k-space data on the subject 9 by combining magnetic resonance signals output by the RF coil 53.

Meanwhile, a geometric error is determined in operation 110 on the basis of a resonant frequency difference between a main component in the subject 9, for example, water, and a chemical shift component, for example, fat, at the same time as or at a different time from the obtaining of the k-space data in operation 100, and a phase error of the chemical shift component is determined in operation 111 on the basis of the determined geometric error.

Here, the geometric error $Z_{cs}$ may be determined in proportion to the resonant frequency difference $f_{cs}$ between the main component and the chemical shift component in the subject 9, and more specifically, may be determined using the resonant frequency difference $f_{cs}$, the gyromagnetic ratio γ, and the size $G_{ss}$ of the slice-select gradient magnetic field.

According to an exemplary embodiment, the geometric error $Z_{cs}$ may be calculated using the above-described Equation 1. That is, the geometric error $Z_{cs}$ may be calculated by dividing the resonant frequency difference $f_{cs}$ by the product of the gyromagnetic ratio γ and the size $G_{ss}$ of the slice-select gradient magnetic field.

The phase error α of the chemical shift component may be determined in proportion to the geometric error $Z_{cs}$, the size $G_b$ of the blip of the gradient magnetic field, and the time $T_b$ at which the blip of the gradient magnetic field is applied to the subject.

According to an exemplary embodiment, the phase error α of the chemical shift component may be calculated using the above-described Equation 2.

In some exemplary embodiments, the phase error α of the chemical shift component may be calculated using the above-described Equation 3. In this case, the above-described calculation process of the geometric error $Z_{cs}$, that is operation 110, may be omitted.

When the k-space data and the phase error α of the chemical shift component are obtained, the k-space data is compared to data on the main component and data on the chemical shift component, in which the k-space data and the phase error α are reflected, (operation 120), and the final data $ρ_s$ for image restoration is determined according to the comparison result in operation 130.

In order to determine the final data $ρ_s$ for image restoration, for example, data in which the phase error is reflected is calculated by the phase error of the chemical shift component being reflected in a vector concatenation between the data on the main component and the data on the chemical shift component, and a first difference between the data in which the phase error of the chemical shift component is reflected and the k-space data is calculated. Sequentially, another piece of data in which the phase error is reflected is calculated by the phase error of the chemical shift component being reflected in another vector concatenation between the data on the main component and the data on the chemical shift component, and a second difference between the other piece of data in which the phase error of the chemical shift component is reflected and the k-space data is calculated. Next, the first difference and the second difference are compared, and as a result of the comparison, a smaller difference of the first difference and the second difference is selected. Still another piece of data in which the phase error is reflected is calculated by the phase error of the chemical shift component being reflected in still another vector concatenation between the data on the main component and the data on the chemical shift component, and a third difference between the still other data in which the phase error of the chemical shift component is reflected and the k-space data is calculated. The selected difference of the first difference and the second difference is compared to the third difference, and as a result of the comparison, a smaller one thereof is selected. As such a process is repeated, a vector concatenation of the data on the main component and the data on the chemical shift component having the smallest difference between the k-space data and the data in which the phase error is reflected is obtained. The obtained vector concatenation is selected as the final data $ρ_s$ for image restoration.

The above-described Equation 4 may be used for the comparison of the data on the main component and the data on the chemical shift component and the obtaining of the final data.

In this case, the phase error operator Θ may be used so that the phase error α can be reflected in the data on the main component and the data on the chemical shift component. The phase error operator Θ may be given, for example, as illustrated in the above-described Equation 6.

Further, in order to obtain the final data $\rho_s$, as illustrated in Equation 4, at least one of the gradient magnetic field phase reflection operator ϕ for reinforcing a phase due to a gradient magnetic field, the chemical shift phase reflection operator ψ for reinforcing the phase error caused by the chemical shift, and the coil sensitivity reflector C for the coil sensitivity being reflected in the data may be further reflected in the vector concentration between the data on the main component and the data on the chemical shift component. The gradient magnetic field phase reflection operator ϕ and the chemical shift phase reflection operator ψ may be expressed in the form of the above-described Equation 5. In the gradient magnetic field phase reflection operator ϕ, θ in Equation 5 may be given as $\gamma*G_b*T_b*z$ with respect to the position z of the slice, and in the chemical shift phase reflection operator ψ, θ in Equation 5 may be given as $2\pi f_{cs}t$ with respect to the obtained time t of the EPI line.

Further, in some exemplary embodiments, in order to determine the final data $\rho_s$, the amount of change $\lambda\|\nabla\rho\|$ of the data on the main component and the data on the chemical shift component may be further reflected in the vector concentration. The reflection of the amount of change $\lambda\|\nabla\rho\|$ of the data on the main component and the data on the chemical shift component may be performed by adding the amount of the change ($\lambda\|\nabla\rho\|$) to the final data $\rho_s$.

When the final data is determined, the image is restored in operation 140 based on the final data. The restored image may be stored in the storage 40 and/or visually provided to the user through the output interface 13.

According to the above-described MRI apparatus and the method of controlling the same, in the case of acquiring an image of a subject, artifacts in the image, which are caused by an excitation position error of a chemical shift material, can be easily removed using a blipped-CAIPI method.

What is claimed is:

1. A method of controlling a magnetic resonance imaging (MRI) apparatus, the method comprising:
   performing, by the MRI apparatus, blipped-controlled aliasing parallel imaging (blipped-CAIPI);
   obtaining k-space data on a subject;
   determining a phase error of a chemical shift component, wherein the phase error of the chemical shift component is proportional to a geometric error based on a resonant frequency difference between a main component and the chemical shift component in the subject;
   comparing the k-space data with data in which the phase error of the chemical shift component is reflected, wherein the data in which the phase error of the chemical shift component is reflected is associated with data on the main component and data on the chemical shift component; and
   determining final data for image restoration based on a result of the comparison.

2. The method according to claim 1, wherein the geometric error is determined in proportion to the resonant frequency difference between the main component and the chemical shift component in the subject.

3. The method according to claim 2, wherein the geometric error is further determined using a gyromagnetic ratio and a size of a gradient magnetic field applied to the subject.

4. The method according to claim 1, wherein the phase error of the chemical shift component is determined in proportion to the geometric error, a size of a blip of a gradient magnetic field, and a time at which the blip of the gradient magnetic field is applied to the subject.

5. The method according to claim 1, wherein the comparing includes:
   calculating the data in which the phase error of the chemical shift component is reflected by the phase error of the chemical shift component being reflected in Fourier transform data of the data on the main component and the data on the chemical shift component;
   calculating a difference between the data in which the phase error of the chemical shift component is reflected and the k-space data; and
   wherein the determining includes determining the final data on based on a result of the calculation of the difference.

6. The method according to claim 5, wherein the calculating of the data in which the phase error of the chemical shift component is reflected includes:
   calculating the data in which the phase error of the chemical shift component is reflected using at least one from among a gradient magnetic field phase reflection operator for reinforcing a phase due to a gradient magnetic field when the blipped-CAIPI is performed, a chemical shift phase reflection operator for reinforcing a phase error caused by chemical shift, and a coil sensitivity reflector for coil sensitivity being reflected in the data, which is further reflected in the Fourier transform data by the MRI apparatus.

7. The method according to claim 6, wherein the determining includes determining the final data in which an amount of change of the data on the main component and the data on the chemical shift component are further reflected.

8. The method according to claim 1, wherein the comparing is calculated as follows, $$\rho = \operatorname*{argmin}_{\rho}\|s - \Theta\Phi\Psi FC\rho\|_2^2 + \lambda\|\nabla\rho\|_1$$

wherein, ρ represents target data, s represents the obtained k-space data, Θ represents a phase error operator for applying the phase error of the chemical shift component, ϕ represents a gradient magnetic field phase reflection operator, ψ represents a chemical shift phase reflection operator, F represents a Fourier transform operator for performing a Fourier transform on each of the main component and the chemical shift component, C represents a generalized coil sensitivity reflector, ρ represents the data on the main component and the data on the chemical shift component, λ represents a normalization coefficient, and ∇ is a gradient operator.

9. The method according to claim 8, wherein Θ is defined as follows, $$\Theta = \exp(-j\alpha)$$

wherein j represents a predefined constant and α represents the phase error of the chemical shift component.

10. The method according to claim 9, wherein the phase error (α) is calculated as follows:

$$\alpha = 2\pi\gamma G_b T_b z_f$$

and $$z_f = \frac{f_f}{\gamma G_{ss}}$$

wherein, $\gamma$ represents a gyromagnetic ratio, $G_b$ represents a size of a blip of a gradient magnetic field, $T_b$ represents a gradient magnetic field application time, $z_f$ represents the geometric error, $f_f$ represents a resonant frequency difference between the main component and the chemical shift component, and $G_{ss}$ represents a size of the gradient magnetic field.

11. An MRI apparatus comprising:

a static magnetic field generator configured to apply a static magnetic field to a subject;

a gradient magnetic field generator configured to apply a gradient magnetic field to the subject the gradient magnetic field generator including a slice-select gradient magnetic field application part, a frequency-encoding gradient magnetic field application part, and a phase-encoding gradient magnetic field application part;

a radio frequency (RF) coil configured to apply an RF pulse to the subject and receive a signal generated by the subject; and a processor configured to obtain k-space data on the subject, wherein the slice-select gradient magnetic field application part is configured to further apply a slice-select gradient magnetic field to the subject and perform blipped-CAIPI, wherein the processor is further configured to determine a phase error of a chemical shift component, compare the k-space data to data in which the phase error of the chemical shift component is reflected, wherein the data in which the phase error of the chemical shift component is reflected is associated with data on a main component and data on a chemical shift component, and determine final data for image restoration based on a result of the comparison, and wherein the phase error of the chemical shift component is proportional to a geometric error based on a resonant frequency difference between the main component and chemical shift component in the subject.

12. The MRI apparatus according to claim 11, wherein the geometric error is determined in proportion to the resonant frequency difference between the main component and the chemical shift component in the subject.

13. The MRI apparatus according to claim 12, wherein the geometric error is further determined using a gyromagnetic ratio and a size of a gradient magnetic field applied to the subject.

14. The MRI apparatus according to claim 11, wherein the phase error of the chemical shift component is determined in proportion to the geometric error, a size of a blip of the gradient magnetic field, and a time at which the blip of the gradient magnetic field is applied.

15. The MRI apparatus according to claim 11, wherein the processor is further configured to calculate the data in which the phase error of the chemical shift component is reflected by the phase error of the chemical shift component being reflected in Fourier transform data of the data on the main component and the data on the chemical shift component, to calculate a difference between the data in which the phase error of the chemical shift component is reflected and the k-space data, and to determine final data based on a result of the calculation of the difference.

16. The MRI apparatus according to claim 15, wherein the processor is further configured to calculate the data in which the phase error of the chemical shift component is reflected using at least one from among a gradient magnetic field phase reflection operator for reinforcing a phase due to the gradient magnetic field when the blipped-CAIPI is performed, a chemical shift phase reflection operator for reinforcing a phase error caused by chemical shift, and a coil sensitivity reflector for coil sensitivity being reflected in the data, which is further reflected in the Fourier transform data by the MRI apparatus.

17. The MRI apparatus according to claim 16, wherein the processor is further configured to determine the final data in which an amount of change of the data on the main component and the data on the chemical shift component are further reflected.

18. The MRI apparatus according to claim 11, wherein the phase error ($\alpha$) is calculated as follows:

$$\alpha = 2\pi\gamma G_b T_b z_f$$

and $$z_f = \frac{f_f}{\gamma G_{ss}}$$

wherein, $\gamma$ represents a gyromagnetic ratio, $G_b$ represents a size of a blip of a gradient magnetic field, $T_b$ represents a gradient magnetic field application time, $z_f$ represents the geometric error, $f_f$ represents the resonant frequency difference between the main component and the chemical shift component, and $G_{ss}$ represents a size of the gradient magnetic field.

* * * * *